United States Patent
Miyazaki et al.

(10) Patent No.: US 9,000,824 B2
(45) Date of Patent: Apr. 7, 2015

(54) OFFSET CANCEL CIRCUIT

(71) Applicant: Yamaha Corporation, Hamamatsu-shi, Shizuoka (JP)

(72) Inventors: Masato Miyazaki, Iwata (JP); Toshio Maejima, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/065,960

(22) Filed: Oct. 29, 2013

(65) Prior Publication Data
US 2014/0118048 A1 May 1, 2014

(30) Foreign Application Priority Data
Oct. 30, 2012 (JP) .................................. 2012-238456

(51) Int. Cl.
*H03L 5/00* (2006.01)
*H03K 5/003* (2006.01)

(52) U.S. Cl.
CPC ...................................... *H03K 5/003* (2013.01)

(58) Field of Classification Search
USPC .................... 327/307; 330/9; 73/1.88
See application file for complete search history.

(56) References Cited

U.S. PATENT DOCUMENTS

| 4,345,477 | A | * | 8/1982 | Johnson | 73/766 |
| 4,887,045 | A | * | 12/1989 | Nakayama | 330/69 |
| 5,012,436 | A | * | 4/1991 | Burri | 702/104 |
| 6,577,187 | B1 | * | 6/2003 | Lesko | 330/11 |
| 6,674,322 | B2 | * | 1/2004 | Motz | 330/9 |
| 6,765,437 | B2 | * | 7/2004 | Goutti et al. | 330/51 |
| 6,924,696 | B2 | * | 8/2005 | Wentink | 330/69 |
| 7,190,217 | B2 | * | 3/2007 | Dai | 330/69 |
| 7,378,905 | B2 | * | 5/2008 | Ferianz et al. | 330/69 |
| 7,420,413 | B2 | * | 9/2008 | Tsurumi | 330/69 |
| 7,492,149 | B2 | * | 2/2009 | Motz et al. | 324/207.2 |
| 8,138,830 | B2 | * | 3/2012 | Bugyik | 330/69 |
| 2009/0027048 | A1 | | 1/2009 | Sato et al. | |
| 2012/0268113 | A1 | | 10/2012 | Sato et al. | |

FOREIGN PATENT DOCUMENTS

JP 2007-212275 A 8/2007

* cited by examiner

*Primary Examiner* — Kenneth B. Wells
(74) *Attorney, Agent, or Firm* — Crowell & Moring LLP

(57) ABSTRACT

An offset cancel circuit includes a first amplifying section, a second amplifying section, a third resistor connected between a non-inverting input terminal of the first amplifying section and a non-inverting input terminal of the second amplifying section, and a current source. In the offset cancel circuit, the current source causes a constant current to flow through the third resistor to cancel an offset voltage from output signals of first and second amplifying sections, the constant current corresponding to the offset voltage contained in first and second output signals output from a bridge resistance type sensor.

5 Claims, 4 Drawing Sheets

OFFSET CANCEL CIRCUIT

BACKGROUND

The present disclosure relates to an offset cancel circuit which cancels an offset voltage contained in output signals of a bridge resistance type sensor configured by bridge-connecting a plurality of resistance elements.

Conventionally, a magnetic sensor is known in which a plurality of GMR elements (Giant MagnetoResistive effective elements) are bridge-connected (for example, JP-A-2007-212275). In a GMR element, in accordance with an external magnetic field, the magnetization direction of the free layer relatively rotates with respect to the fixed magnetization direction of the pinned layer, so that the electric resistance is changed. When attention is focused on the electric characteristics of a GMR element, a GMR element is one kind of resistance element. In the case where a plurality of GMR elements constitute a bridge circuit, therefore, an external magnetic field can be sensed by a change in potential balance of the two midpoint nodes of the bridge circuit.

However, GMR elements are dispersed in resistance. In a state where an external magnetic field is not applied, therefore, the potential difference between the two midpoint nodes of a bridge circuit becomes not zero, and an offset voltage is generated. When an external magnetic field is to be measured by the output of a magnetic sensor, consequently, the offset voltage must be cancelled.

FIG. 4 shows an example of a related offset cancel circuit 95. The related offset cancel circuit 95 includes current sources 96, 97 which are connected respectively to two midpoint nodes a, b of a magnetic sensor 90 configured by bridge-connecting four GMR elements 91, 92, 93, 94. The current sources 96, 97 cause preset constant currents I1, I2 to flow respectively through the two midpoint nodes a, b in the bridge circuit, thereby cancelling an offset voltage Voff appearing across output terminals A, B. Since the dispersion of the resistances of the GMR elements 91 to 94 can be previously measured, namely, the offset cancel circuit 95 adjusts the currents I1, I2 produced in the current sources 96, 97, based on the dispersion which is previously measured, and generates a voltage drop corresponding to the dispersion in the bridge circuit, to cancel the offset voltage Voff.

In the related offset cancel circuit 95, however, the current sources 96, 97 for causing the currents to flow through the magnetic sensor 90 are formed on a semiconductor chip by a CMOS process, and therefore the materials of the internal resistances for generating the constant currents in the current sources 96, 97 are different from those of the GMR elements 91 to 94 through which the constant currents flow. As a result, the resistances of the GMR elements 91 to 94 exhibit temperature characteristics which are different from those of the internal resistances of the current sources 96, 97. When the temperature is changed, therefore, the currents I1, I2 generated in the current sources 96, 97 have values which are deviated from values that are adequate to cancel the dispersion of the resistances of the GMR elements 91 to 94. Therefore, the related offset cancel circuit 95 has a problem in that it is difficult to, in an arbitrary temperature range, adequately generate a voltage drop corresponding to the resistance dispersion, in the bridge circuit, and the offset voltage Voff can be cancelled only at a specific temperature.

This problem is not limited to the magnetic sensor 90 which is configured by bridge-connecting the plurality of GMR elements 91 to 94, but this problem is also applied to bridge resistance type sensors in which a plurality of resistance elements are bridge-connected.

SUMMARY

The present disclosure has been conducted in order to solve the problem of the related art. It is an object of the present disclosure to provide an offset cancel circuit in which, without being affected by temperature characteristics of resistance elements constituting a bridge circuit, an offset voltage generated by dispersion of the resistance elements can be adequately canceled.

In order to achieve the above object, according to the present disclosure, there is provided an offset cancel circuit for canceling an offset voltage contained in output signals of a bridge resistance type sensor having a plurality of resistance elements connected in bridge-connection, the offset cancel circuit comprising:

a first amplifying section configured to receive a first output signal output from the bridge resistance type sensor at a non-inverting input terminal of the first amplifying section and to amplify the first output signal, wherein a first resistor is interposed in a first negative feedback path connecting an output terminal of the first amplifying section to an inverting input terminal of the first amplifying section;

a second amplifying section configured to receive a second output signal output from the bridge resistance type sensor at a non-inverting input terminal of the second amplifying section and to amplify the second output signal, wherein a second resistor is interposed in a second negative feedback path connecting an output terminal of the second amplifying section to an inverting input terminal of the second amplifying section;

a third resistor that is connected between the non-inverting input terminal of the first amplifying section and the non-inverting input terminal of the second amplifying section; and a current source that causes a constant current to flow through the third resistor, wherein the current source causes the constant current to flow through the third resistor to cancel the offset voltage from the output signals of the first and second amplifying sections, the constant current corresponding to the offset voltage contained in the first and second output signals output from the bridge resistance type sensor.

According to the present disclosure, no current flows through the resistance elements constituting a bridge circuit, and therefore the offset voltage generated by dispersion of the resistance elements can be adequately canceled without being affected by the temperature characteristics of the resistance elements.

BRIEF DESCRIPTION OF THE DRAWINGS

The above objects and advantages of the present disclosure will become more apparent by describing in detail preferred exemplary embodiments thereof with reference to the accompanying drawings, wherein.

DETAILED DESCRIPTION OF EXEMPLARY EMBODIMENTS

Figure 1:
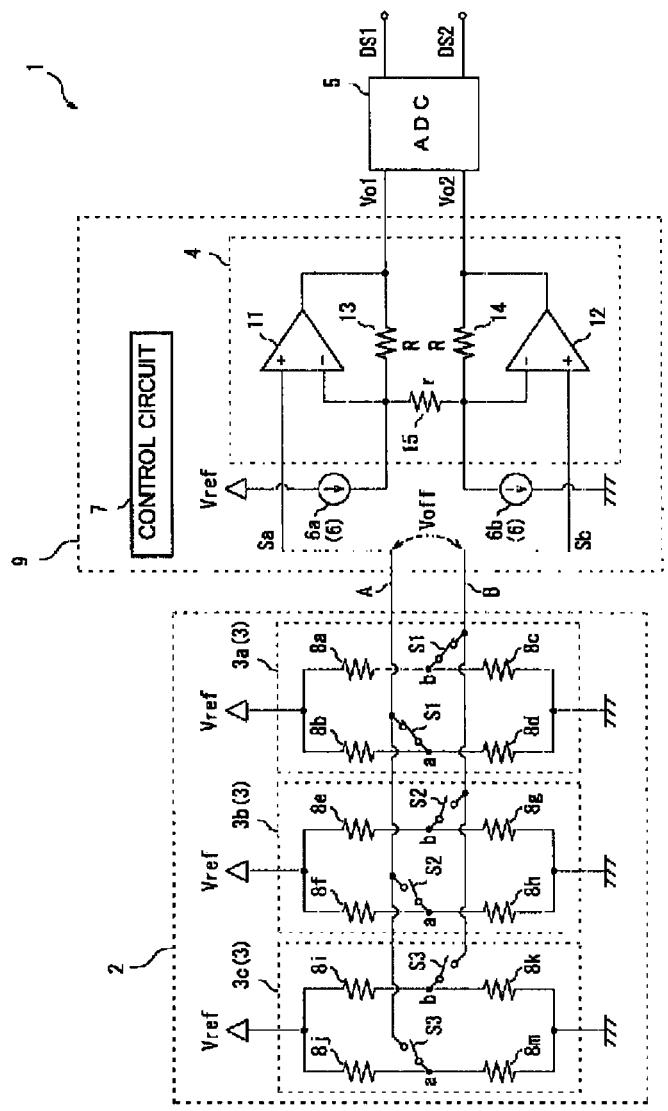
FIG. 1 is a circuit diagram showing a configuration of a sensor circuit including an offset cancel circuit.

Hereinafter, preferred embodiments of the present disclosure will be described in detail with reference to the drawings.

The members which are common in the embodiments described below are denoted by the same reference numerals, and their duplicated description will be omitted.

FIG. 1 is a circuit diagram showing a configuration of a sensor circuit 1 including the offset cancel circuit 9 of the present disclosure. The sensor circuit 1 includes a sensor section 2, the offset cancel circuit 9, and an AD (Analog/Digital) converter 5.

The sensor section 2 includes three magnetic sensors 3a, 3b, 3c for sensing external magnetic fields in three directions which are orthogonal to one another, and is configured so that the magnetic sensors 3a, 3b, 3c sense external magnetic fields in different directions, respectively. The sensor section 2 sequentially transfers one by one the three magnetic sensors 3a, 3b, 3c to a measurement mode in a time division manner, and outputs output signals of the magnetic sensor 3a, 3b, or 3c which is in the measurement mode, from a pair of output terminals A, B.

The magnetic sensor 3a constitutes a bridge resistance type sensor 3 which is configured by bridge-connecting four resistance elements 8a, 8b, 8c, 8d each formed by a GMR element. Namely, the junction point of the resistance elements 8a, 8b is connected to a reference voltage Vref, and that of the resistance elements 8c, 8d is grounded. The junction point of the resistance elements 8b, 8d functions as one midpoint node a of the bridge circuit, and that of the resistance elements 8a, 8c functions as the other midpoint node b of the bridge circuit. The magnetic sensor 3a has switches S1, S1 for connecting the two midpoint nodes a, b of the bridge circuit to the pair of output terminals A, B, respectively.

Similarly, the magnetic sensor 3b constitutes another bridge resistance type sensor 3 which is configured by bridge-connecting four resistance elements 8e, 8f, 8g, 8h each formed by a GMR element, and has switches S2, S2 for connecting the two midpoint nodes a, b of the bridge circuit to the pair of output terminals A, B, respectively. Moreover, the magnetic sensor 3c constitutes a further bridge resistance type sensor 3 which is configured by bridge-connecting four resistance elements 8i, 8j, 8k, 8m each formed by a GMR element, and has switches S3, S3 for connecting the midpoint nodes a, b of the bridge circuit to the output terminals A, B, respectively.

The sensor section 2 selectively sets one of the switch pairs S1, S2, S3 disposed in the magnetic sensors 3a, 3b, 3c to a closed state, thereby sequentially transferring the magnetic sensors 3a, 3b, 3c to the measurement mode. In each of the magnetic sensors 3a, 3b, 3c, when set to the measurement mode, the potentials of the midpoint nodes a, b which are obtained by dividing the reference voltage Vref by the corresponding resistance elements are output to the output terminals A, B, respectively. At this time, when an external magnetic field is applied to each of the magnetic sensors 3a, 3b, 3c, the resistances of the GMR elements constituting the bridge circuit are changed in accordance with the external magnetic field, and therefore a potential difference corresponding to the external magnetic field is produced between the two output terminals A, B. However, output signals output from the output terminals A, B of the sensor section 2 contain not only the potential difference corresponding to the external magnetic field, but also an offset voltage Voff caused by the dispersion of the resistances of the GMR elements constituting the bridge circuit.

The offset cancel circuit 9 receives the output signals output from the pair of output terminals A, B of the sensor section 2, cancels the offset voltage Voff contained in the output signals, and amplifies and outputs only signal components corresponding to the external magnetic field. The offset cancel circuit 9 includes an amplifying section 4 which amplifies the output signals output from the sensor section 2, a current source 6 which generates a constant current, and a control circuit 7 which controls the current source 6. Among these components, at least the amplifying section 4 and the current source 6 are formed on the same semiconductor chip by a CMOS process.

The amplifying section 4 includes an operational amplifier 11 functioning as a first amplifying section which amplifies the output signal supplied from the sensor section 2 to the output terminal A, and an operational amplifier 12 functioning as a second amplifying section which amplifies the output signal supplied from the sensor section 2 to the output terminal B. The operational amplifiers 11, 12 constitute an instrumentation amplifier. In the operational amplifier 11, a first resistor 13 is interposed in a negative feedback path in which the output terminal and inverting input terminal of the operational amplifier 11 are connected to each other, a first output signal Sa which is output from the sensor section 2 to the output terminal A is input to the non-inverting input terminal of the operational amplifier 11, and an output signal Vo1 of the operational amplifier 11 is output. In the operational amplifier 12, a second resistor 14 is interposed in a negative feedback path in which the output terminal and inverting input terminal of the operational amplifier 12 are connected to each other, a second output signal Sb which is output from the sensor section 2 to the output terminal B is input to the non-inverting input terminal of the operational amplifier 12, and an output signal Vo2 of the operational amplifier 12 is output. The first and second resistors 13, 14 have the same resistance value of R. The amplifying section 4 further includes a third resistor 15. The non-inverting input terminals of the operational amplifiers 11, 12 are connected to each other through the third resistor 15. The third resistor 15 has a resistance value of r.

The current source 6 causes a constant current to flow through the third resistor 15 of the amplifying section 4. In the embodiment, two current sources 6a, 6b which respectively generate the same current are disposed as the current source 6. The one current source 6a is disposed between the reference voltage Vref and one end of the third resistor 15, generates the constant current for canceling the offset voltage Voff contained in the output signals output from the output terminals A, B of the sensor section 2, and outputs the constant current to the one end of the third resistor 15. The other current source 6b is disposed between the other end of the third resistor 15 and a grounding terminal, generates the constant current for canceling the offset voltage Voff contained in the output signals output from the output terminals A, B of the sensor section 2, and outputs the constant current to the grounding terminal. Therefore, the current which is supplied to the one end of the third resistor 15 by the one current source 6a is absorbed from the other end of the third resistor 15 by the other current source 6b, and hence the constant current produced by the current sources 6a, 6b flows only through the third resistor 15 of the amplifying section 4. The value of the constant current generated in the current sources 6a, 6b can be adjusted.

The control circuit 7 controls the constant current generated in the two current sources 6a, 6b, so as to have a predetermined value. The control circuit 7 holds a measurement value which is obtained by previously measuring the offset voltages Voff caused by dispersion of the resistances of the resistance elements 8a to 8m of the above-described three magnetic sensors 3a, 3b, 3c, and, when each of the magnetic sensors 3a, 3b, 3c is in the measurement mode, controls the constant current generated in the current sources 6a, 6b, so as to have a predetermined value, based on the measurement value.

The AD converter 5 converts the output signals Vo1, Vo2 output from the amplifying section 4 of the offset cancel circuit 9, to respective digital signals DS1, DS2 having a predetermined bit number, and outputs the digital signals.

Figure 2:
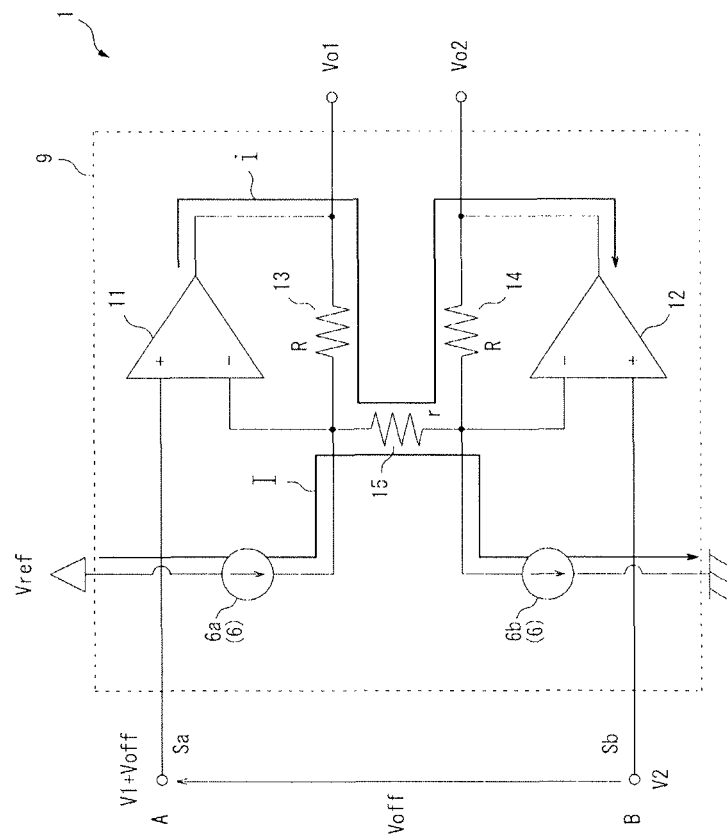
FIG. 2 is an enlarged diagram showing a main portion of the offset cancel circuit.

Next, the operation of the offset cancel circuit 9 will be described. FIG. 2 is a diagram enlargedly showing a main portion of the offset cancel circuit 9. It is assumed that, as shown in FIG. 2, the offset voltage Voff appears between the output terminals A, B of the sensor section 2, the output signal supplied to the output terminal A of the sensor section 2 is (V1+Voff), and that supplied to the output terminal B is V2. At this time, the control circuit 7 controls the current sources 6a, 6b so that, in order to cancel the offset voltage Voff, the constant current I flows through the third resistor 15. At this time, moreover, the operational amplifiers 11, 12 operate to cause the current i to flow through each of the first, second, and third resistors 13, 14, 15.

The operational amplifier 11 operates so as to equalize the potentials of the inverting input terminal and the non-inverting input terminal with each other. Therefore, the potential of the junction point of the first and third resistors 13, 15 is (V1+Voff). Similarly, the operational amplifier 12 operates so as to equalize the potentials of the inverting input terminal and the non-inverting input terminal with each other. Therefore, the potential of the junction point of the third and second resistors 15, 14 is V2. Because of relationships between the currents respectively flowing through the first, second, and third resistors 13, 14, 15 and the potential differences, consequently, the following three formulae hold.

$$Vo1-(V1+Voff)=Ri \quad \text{(Formula 1)}$$

$$V2-Vo2=Ri \quad \text{(Formula 2)}$$

$$V1+Voff-V2=r(I+I) \quad \text{(Formula 3)}$$

When the differential output (Vo1−Vo2) of the operational amplifiers 11, 12 is obtained from the above three formulae, following Formula 4 holds.

$$Vo1 - Vo2 = \frac{r+2R}{r}(V1 - V2) + \frac{r+2R}{r}Voff - 2RI \quad \text{(Formula 4)}$$

In Formula 4 above, when a combination of the second and third terms of the right side is set to zero, it is possible to cancel an influence of the offset voltage Voff from the difference output (Vo1−Vo2). Therefore, the constant current I which is generated in the current sources 6a, 6b is as indicated in following Formula 5.

[Exp. 3]

$$I = \frac{r+2R}{2Rr}Voff \quad \text{(Formula 5)}$$

The control circuit 7 can cancel the offset voltage Voff from the output signals Vo1, Vo2 output from the offset cancel circuit 9, by adjusting the value of the constant current I generated in the current sources 6a, 6b based on Formula 5 above. In this case, the differential output (Vo1−Vo2) of the operational amplifiers 11, 12 is expressed as following Formula 6.

$$Vo1 - Vo2 = \frac{r+2R}{r}(V1 - V2) \quad \text{(Formula 6)}$$

Namely, by the current adjustment of the control circuit 7, the current sources 6a, 6b cause the current I indicated by Formula 5 to through the third resistor 15, thereby enabling the amplifying section 4 to produce the differential output (Vo1−Vo2) in which only a potential difference (V1−V2) between the midpoint nodes a, b and due to the influence of the external magnetic field is amplified.

At the timing when each of the magnetic sensors 3a, 3b, 3c is sequentially transferred to the measurement mode, moreover, the control circuit 7 switches the value of the current I generated in the current sources 6a, 6b in accordance with the offset voltage Voff of the magnetic sensor 3a, 3b, or 3c, whereby the offset voltage Voff generated in the magnetic sensor 3a, 3b, or 3c can be canceled even when any one of the three magnetic sensors 3a, 3b, 3c is in the measurement mode. As a result, the pair of digital signals DS1, DS2 output from the AD converter 5 of the sensor circuit 1 become signals in which the offset voltages Voff caused by the dispersion of the resistances of the resistance elements 8a to 8m constituting the bridge circuits in the magnetic sensors 3a, 3b, 3c are canceled.

In the offset cancel circuit 9, as described above, at least the amplifying section 4 and the current source 6 are formed on the same semiconductor chip by a CMOS process. In the case where the pair of current sources 6a, 6b include an internal resistance in order to generate the constant current I, therefore, the internal resistances are formed by the same material (for example, polysilicon) as that of the first, second, and third resistors 13, 14, which are disposed in the amplifying section 4, so that the temperature characteristics of the internal resistances disposed in the current sources 6a, 6b coincide with those of the first, second, and third resistors 13, 14, 15. Even when the temperature is changed and the resistances of the first, second, and third resistors 13, 14, 15 are varied, consequently, the values of the internal resistances of the current sources 6a, 6b are similarly varied. Therefore, the value of the constant current I can be made to follow the variations of the resistances of the first, second, and third resistors 13, 14, 15, and always maintained to a value at which the offset voltage Voff is canceled.

Unlike the related circuit, when the offset voltage Voff is to be canceled in the magnetic sensors 3a, 3b, 3c, the offset cancel circuit 9 does not cause currents to flow through the resistance elements 8a to 8m which are disposed in the magnetic sensors 3a, 3b, 3c, and which have different temperature characteristics. Therefore, the offset cancel circuit is not affected by the temperature characteristics of the resistance elements 8a to 8m each of which is configured by a GMR element.

By contrast, usually, each of the GMR elements disposed in the magnetic sensors 3a, 3b, 3c has a structure where a first ferromagnetic layer, a non-magnetic layer, a second ferromagnetic layer, and an antiferromagnetic layer are stacked. The resistance elements 8a to 8m each of which is configured by such a GMR element have the temperature characteristics corresponding to the material. When the temperature is changed, therefore, the resistances of the resistance elements 8a to 8m are changed. The resistance changes of the resistance elements 8a to 8m due to the temperature change can be canceled by taking out the potentials of the midpoint nodes a, b of the bridge circuit, to the output terminals A, B. Therefore, the offset cancel circuit 9 of the embodiment can always satisfactorily cancel the offset voltages Voff produced in the magnetic sensors 3a, 3b, 3c, without receiving any influence due to the temperature characteristics.

As described above, the offset cancel circuit 9 of the embodiment includes the current sources 6a, 6b which cause the constant current I to flow through the third resistance 15 of the amplifying section 4, in order to cancel the offset voltages Voff contained in the output signals of the magnetic sensors 3a, 3b, 3c which are configured by bridge-connecting the plurality of resistance elements 8a to 8m. The current sources 6a, 6b are configured so that the constant current I corresponding to the offset voltage Voff contained in the first and second output signals Sa, Sb output from each of the magnetic sensors 3a, 3b, 3c is caused to flow through the third resistor 15, thereby canceling the offset voltage Voff from the output signal of the amplifying section 4. According to the configuration, no current flows through the resistance elements 8a to 8m constituting the magnetic sensors 3a, 3b, 3c, and therefore the offset voltages Voff due to dispersion of the resistances of the resistance elements 8a to 8m can be always adequately canceled without being affected by the temperature characteristics of the resistance elements 8a to 8m.

In the offset cancel circuit 9 of the embodiment, as described above, the internal resistances for generating the constant current I in the current sources 6a, 6b are formed by the same material as that of the first to third resistors 13 to 15. Therefore, the internal resistances of the current sources 6a, 6b, and the first to third resistors 13 to 15 exhibit the same temperature characteristics. Consequently, the current sources 6a, 6b can generate the constant current I for adequately canceling the offset voltages Voff in an arbitrary temperature range, and cause the constant current to flow through the third resistor 15.

The offset cancel circuit 9 of the embodiment has the configuration where the above-described current sources 6a, 6b are formed on the same semiconductor chip as that on which the first to third resistors 13 to 15 are formed. According to the configuration, even when the temperature of the semiconductor chip is changed, the internal resistances of the current sources 6a, 6b, and the first to third resistors 13 to 15 can be maintained to the same temperature. Therefore, the constant current I generated in the current sources 6a, 6b can be maintained to an adequate value.

The offset cancel circuit 9 of the embodiment further includes the control circuit 7 which controls the current sources 6a, 6b. The control circuit 7 adjusts the current flowing through the third resistor 15, by controlling the current sources 6a, 6b based on the measurement value which is obtained by previously measuring the offset voltage Voff of the first and second output signals Sa, Sb output from each of the magnetic sensors 3a, 3b, 3c. Therefore, the offset voltage Voff contained in the output signal output from each of the magnetic sensors 3a, 3b, 3c can be adequately cancelled even when the offset voltage Voff has any value.

Although the embodiment of the present disclosure has been described, the present disclosure is not limited to the contents described above.

Figure 3:
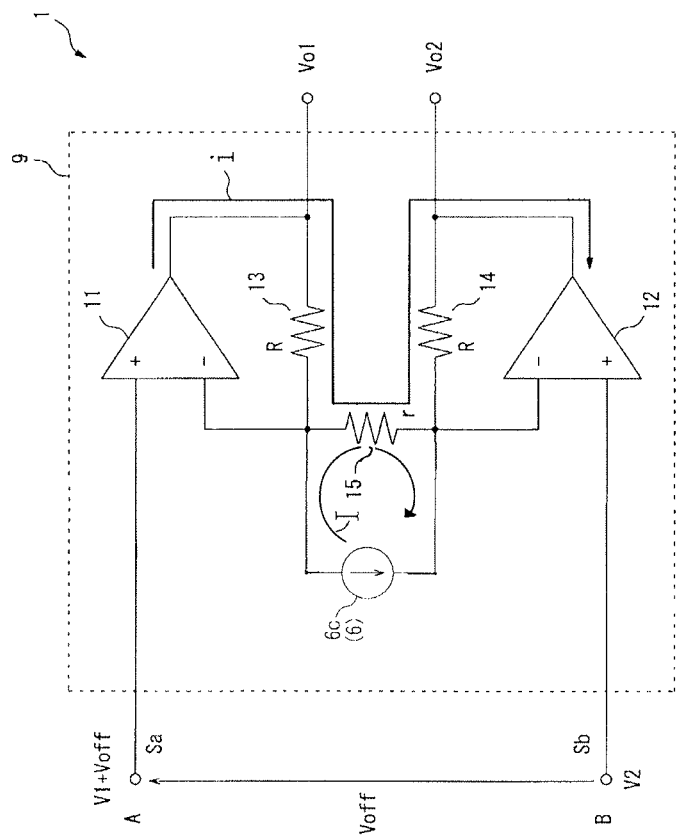
FIG. 3 is an enlarged diagram showing a main portion of an offset cancel circuit according to a modified embodiment.
Figure 4:
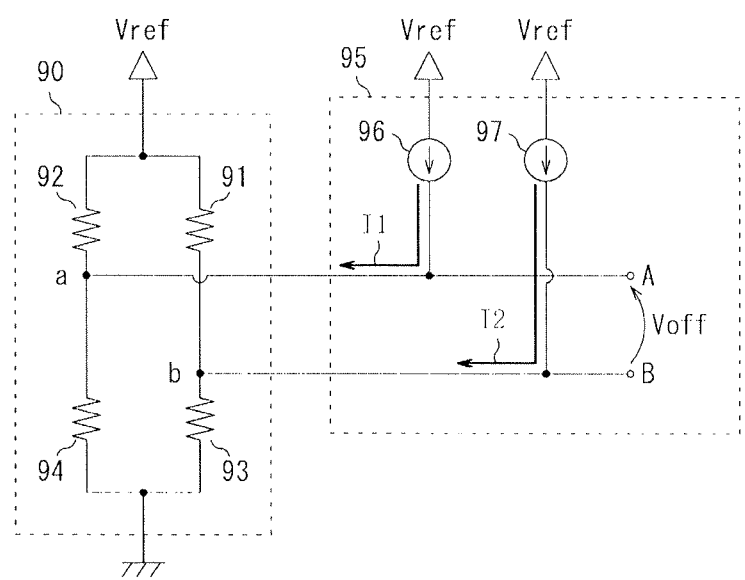
FIG. 4 is a diagram showing an example of a related offset cancel circuit.

In the offset cancel circuit 9 of the above embodiment, the offset cancel circuit 9 includes two current sources 6a, 6b. However, the offset cancel circuit 9 may have one current source 6c as one modified embodiment shown in FIG. 3, instead of the two current sources 6a, 6b. FIG. 3 is an enlarged diagram showing a main portion of another offset cancel circuit according to a modified embodiment. The current source 6c is arranged between the inverting input terminals of the operational amplifiers 11, 12 and is connected in parallel to the third resistor 15. The constant current produced by the current sources 6c flows only through the third resistor 15. The value of the constant current generated in the current sources 6c can be adjusted. Such modified embodiment can also achieve same advantageous as that of the above embodiment.

In the embodiment, for example, the magnetic sensors 3a, 3b, 3c have been exemplarily described as an example of the bridge resistance type sensor 3. However, the application range of the offset cancel circuit 9 is not always limited to magnetic sensors. For example, the bridge resistance type sensor 3 may be configured by pressure sensors. Namely, the above-described offset cancel circuit 9 can cancel the offset voltages Voff contained in an output signal of an arbitrary bridge resistance type sensor 3 which is configured by bridge-connecting a plurality of resistance elements.

Even when, as in the embodiment, the bridge resistance type sensor 3 is configured by magnetic sensors, it is not always necessary to, as described above, configure the magnetic sensors 3a, 3b, 3c by the resistance elements 8a to 8m formed by GMR elements. Among magnetic sensors configured by bridge-connecting a plurality of resistance elements, there are ones in which Hall elements, TMR elements (Tunneling MagnetoResistive effect elements), or the like are used as the resistance elements. Therefore, the magnetic sensors 3a, 3b, 3c may be configured by using resistance elements other than GMR elements.

As the embodiment, the example has been described in which the control circuit 7 adjusts the constant current I generated in the current sources 6a, 6b, based on the measurement value which is obtained by previously measuring the offset voltage Voff. However, the measurement value is not limited to the offset voltage Voff, and may be dispersion of the resistances of the resistance elements constituting the bridge circuit. Since the dispersion of the resistances of the resistance elements constituting the bridge circuit correlates with the offset voltage Voff, the previous measurement of the offset voltages Voff is technically equivalent in meaning to the previous measurement of the dispersion of the resistances.

Here, the concepts of the above embodiments are summarized as follows.

An offset cancel circuit for canceling an offset voltage contained in output signals of a bridge resistance type sensor having a plurality of resistance elements connected in bridge-connection, comprises:

a first amplifying section configured to receive a first output signal output from the bridge resistance type sensor at a non-inverting input terminal of the first amplifying section and to amplify the first output signal, wherein a first resistor is interposed in a first negative feedback path connecting an output terminal of the first amplifying section to an inverting input terminal of the first amplifying section;

a second amplifying section configured to receive a second output signal output from the bridge resistance type sensor at a non-inverting input terminal of the second amplifying section and to amplify the second output signal, wherein a second resistor is interposed in a second negative feedback path connecting an output terminal of the second amplifying section to an inverting input terminal of the second amplifying section;

a third resistor that is connected between the non-inverting input terminal of the first amplifying section and the non-inverting input terminal of the second amplifying section; and a current source that causes a constant current to flow through the third resistor, wherein the current source causes the constant current to flow through the third resistor to cancel the offset voltage from the output signals of the first and second amplifying sections, the constant current corresponding to the offset voltage contained in the first and second output signals output from the bridge resistance type sensor.

For example, the current source has an internal resistance which generates the constant current, and the internal resistance is formed by a same material as materials of the first to third resistors.

For example, the current source and the first to third resistors are formed are formed on a same semiconductor chip.

For example, the offset cancel circuit further comprises a controlling section configured to control the current source, wherein based on a measurement value which is obtained by previously measuring the offset voltage of the first and second output signals output from the bridge resistance type sensor, the controlling section controls the current source to adjust the constant current flowing through the third resistor.

For example, the bridge resistance type sensor and other bridge resistance type sensor are selectively connected to the inverting input terminals of the first and second amplifying sections, and based on measurement values which are obtained by previously measuring the offset voltage of the first and second output signals output from the bridge resistance type sensors, the controlling section controls the current source to adjust the constant current flowing through the third resistor in accordance with the selected one of the bridge resistance type sensors.

For example, the plurality of resistance elements of the bridge resistance type sensor are Giant MagnetoResistive effective elements.

Although the present disclosure has been illustrated and described for the particular preferred embodiments, it is apparent to a person skilled in the art that various changes and modifications can be made on the basis of the teachings of the present disclosure. It is apparent that such changes and modifications are within the spirit, scope, and intention of the present disclosure as defined by the appended claims.

The present application is based on Japanese Patent Application No. 2012-238456 filed on Oct. 30, 2012, the contents of which are incorporated herein by reference.

What is claimed is:

1. An offset cancel circuit for canceling an offset voltage contained in output signals of a bridge resistance type sensor having a plurality of resistance elements connected in bridge-connection, the offset cancel circuit comprising:
    a first amplifying section configured to receive a first output signal output from the bridge resistance type sensor at a non-inverting input terminal of the first amplifying section and to amplify the first output signal, wherein a first resistor is interposed in a first negative feedback path connecting an output terminal of the first amplifying section to an inverting input terminal of the first amplifying section;
    a second amplifying section configured to receive a second output signal output from the bridge resistance type sensor at a non-inverting input terminal of the second amplifying section and to amplify the second output signal, wherein a second resistor is interposed in a second negative feedback path connecting an output terminal of the second amplifying section to an inverting input terminal of the second amplifying section;
    a third resistor that is connected between the inverting input terminal of the first amplifying section and the inverting input terminal of the second amplifying section; and
    a current source that causes a constant current to flow through the third resistor,
    wherein the current source causes the constant current to flow through the third resistor to cancel the offset voltage from the output signals of the first and second amplifying sections, the constant current corresponding to the offset voltage contained in the first and second output signals output from the bridge resistance type sensor, and
    wherein the current source has an internal resistance which generates the constant current, and the internal resistance is formed by a same material as materials of the first to third resistors.

2. The offset cancel circuit according to claim 1, wherein the current source and the first to third resistors are formed on a same semiconductor chip.

3. The offset cancel circuit according to claim 1, further comprising:
    a controlling section configured to control the current source,
    wherein based on a measurement value which is obtained by previously measuring the offset voltage of the first and second output signals output from the bridge resistance type sensor, the controlling section controls the current source to adjust the constant current flowing through the third resistor.

4. The offset cancel circuit according to claim 3, wherein the bridge resistance type sensor and another bridge resistance type sensor are selectively connected to the non-inverting input terminals of the first and second amplifying sections; and
    wherein based on measurement values which are obtained by previously measuring the offset voltage of the first and second output signals output from the bridge resistance type sensors, the controlling section controls the current source to adjust the constant current flowing through the third resistor in accordance with the selected one of the bridge resistance type sensors.

5. The offset cancel circuit according to claim 1, wherein the plurality of resistance elements of the bridge resistance type sensor are Giant MagnetoResistive effective elements.

* * * * *